April 30, 1968 J. D. HUSHER ET AL 3,380,153

METHOD OF FORMING A SEMICONDUCTOR INTEGRATED CIRCUIT THAT INCLUDES A FAST SWITCHING TRANSISTOR

Filed Sept. 30, 1965

WITNESSES

Edwin E. Bassler

James F. Young

INVENTORS
John D. Husher &
Paul M. Kisinko
BY Gordon H. Telfer
ATTORNEY 3,380,153
Patented Apr. 30, 1968

3,380,153

METHOD OF FORMING A SEMICONDUCTOR INTEGRATED CIRCUIT THAT INCLUDES A FAST SWITCHING TRANSISTOR

John D. Husher, Ellicott City, Md., and Paul M. Kisinko, Greensburg, Pa., assignors to Westinghouse Electric Corporation, Pittsburgh, Pa., a corporation of Pennsylvania Filed Sept. 30, 1965, Ser. No. 500,461
4 Claims. (Cl. 29—577)

Figure 1:
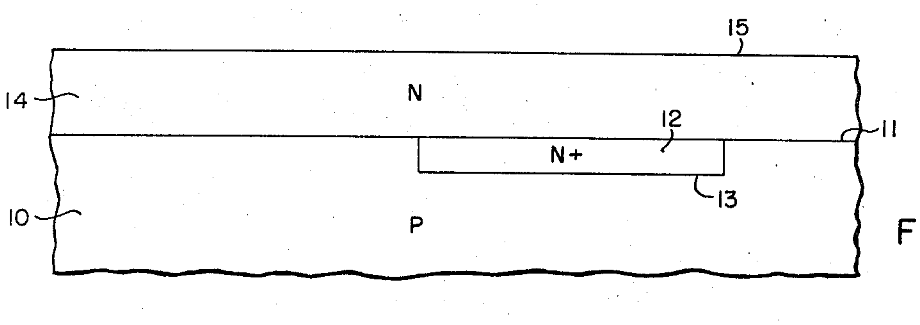

This invention relates generally to semiconductor integrated circuits and more particularly to methods of forming integrated circuits for digital logic applications, or the like, that include a fast switching transistor.

The desirable features for a good high speed switching transistor are well known. In individual components these may be fairly readily achieved. However, in making such a transistor in an integrated circuit, additional problems are encountered because of the requirements of forming additional component structures in the same integrated circuit with internal isolation therebetween. Similar considerations apply to forming integrated circuits having transistor amplifiers with a good frequency response.

In one type of integrated circuit switching transistor structure, previous to this invention, two epitaxial layers of, for example, n type semiconductivity would be formed on a p type substrate with the layer adjacent the substrate being much more highly doped. Portions of the layers were isolated by diffusing a p type wall through the layers. In the isolated portions component structures were formed wherein the low resistivity layer portion served to minimize the saturation resistance of switching transistors. Such a structure and method of fabrication have been successfully employed. However, disadvantages are encountered. During the growth of the second layer a process known as "out-diffusion" or "auto-doping" takes place whereby impurities from the first layer or from silicon grown on the boat enter the second layer. In order to achieve a desirable high resistivity at the base-collector junction, a thick second layer must be formed to overcome the effect of auto-doping.

The thicker epitaxial layers require additional diffusion time to form the isolation wall. This results in further out-diffusion from the first epitaxial layer into the second.

Because of the additional distance required to form the isolation wall, it is, when finally formed, thicker than would otherwise be the case thus constituting an additional capacitance from the transistor collector to ground, the isolation wall usually being grounded.

Furthermore, the breakdown of the device may be limited by the breakdown voltage of the junction between the first epitaxial layer and the isolation wall, which is relatively low.

In order to minimize these effects, that is reduce the isolation capacitance and increase isolation breakdown, the resistivity of the first layer must be increased. However, this increases the transistor saturation resistance. Therefore, with this type of structure and method of making it a dilemma is presented to the integrated circuit designer.

Substantial improvements over this type of structure have been proposed in forming by an additional diffusion a highly doped collector wall through the second epitaxial layer down to the first epitaxial layer thus, all other factors being the same, minimizing the saturation resistance. Problems of out-diffusion still exist however. For further description of such devices and their fabrication, reference should be made to copending application Ser. No. 353,524, filed Mar. 20, 1964 by Husher and Pollock and assigned to the assignee of the present invention.

Another type of structure that has been used for a switching transistor in integrated circuits is one in which a highly doped floating collector region is formed by diffusion into the surface of the substrate in those areas desired for transistor structures and a single epitaxial layer of high resistivity is formed over that surface. Together with the use of a collector wall as described in the referred-to copending application, such structures have generally favorable characteristics compared with those previously used. Such structures have, however, previously required several separate diffusion operations that still result in problems of out-diffusion, stray capacitance, and long fabrication time.

It is, therefore, an object of the present invention to provide an improved method of making integrated circuits having switching transistor structures wherein the time required to form a satisfactory structure is minimized.

Another object is to provide a method of fabricating integrated circuits to reduce the switching time of transistors.

Another object is to provide an improved method of forming integrated circuits with switching transistor structures that, compared with prior techniques, are more readily capable of providing low stray collector to ground capacitance and to minimize auto-doping during epitaxial growth operations.

The present invention achieves the above-mentioned and additional objects and advantages in a method wherein a floating collector region is formed in a substrate and a single epitaxial layer of higher resistivity is formed over the surface with the floating collector. Impurities for the isolation wall, a collector wall and the transistor base region are all deposited prior to a simultaneous redistribution of those impurities. The impurities for the isolation and collector walls extend all the way through the epitaxial layer but those for the base region, being less in quantity, terminate to form a p-n junction in the epitaxial layer. The simultaneous redistribution of impurities substantially shortens overall fabrication time and hence minimizes out-diffusion from the floating collector. It is further desirable that the impurity forming the floating collector region be one having a slow diffusion characteristic such as antimony, when forming n-p-n transistors. Furthermore, it is preferred to form the epitaxial layer as thin as possible as indicated above. This is facilitated by using a low temperature epitaxial growth technique, that is, one that forms an epitaxial layer while maintaining the substrate at a temperature of less than 1150° C.

The present invention, together with the above mentioned and additional objects and advantages thereof will be better understood by referring to the following description taken with the accompanying drawing wherein:

FIGURES 1 through 4 are partial sectional views of one embodiment of an integrated circuit made in accordance with this invention at various stages in the fabrication process.

Referring to the drawing, FIG. 1 shows a substrate 10 of a semiconductive material such as silicon that is of a particular type of semiconductivity, p type in this example. The substrate 10 has substantially planar surface 11 in which an opposite type region 12 is disposed forming a junction 13. The region 12 is relatively highly doped and is designated as of n+ type material. Over the surface 11 and covering the region 12 is an n type epitaxial layer 14. The epitaxial layer 14 has a substantially planar surface 15 remote from the substrate 10 on which subsequent diffusion operations are performed to complete the integrated circuit structure.

The substrate 10 is of single crystal material formed by conventional techniques that may suitably to boron doped to have a resistivity of from about 10 ohm centimeters to about 100 ohm centimeters or more. The region 12 may be formed by conventional selective diffusion, using a slow diffusing impurity such as antimony as the doping impurity, to a surface concentration of from about $10^{17}$ atoms per cubic centimeter to about $5\times10^{17}$ atoms per cubic centimeter. Other suitable donor impurities to form region 12 include arsenic. Suitable p type impurities to form a structure of opposite semiconductivity type include gallium.

The epitaxial layer 14 is formed by an epitaxial growth process that requires heating the substrate only to a temperature of less than about 1150° C. This means that processes utilizing the reduction of silicon halide compounds are not preferred because of inadequate growth rates below 1150° C. What is preferred is a process such as that involving the reduction of silane $SiH_4$, by pyrolytic decomposition at a temperature of from about 1100° C. to about 1150° C. with which growth rates approximating one micron per minute may be achieved. For purposes of this invention, the epitaxial layer 14 may suitably have a thickness of from about 5 microns to 7 microns and a resistivity of from about 0.25 to 0.4 ohm-cm. micron.

The preference for a slow diffusing element as the doping impurity in the region 12 is to minimize out-diffusion. The fact that the epitaxial layer 14 is, preferably, formed as a relatively low temperature also minimizes out-diffusion from the region 12.

Figure 2:
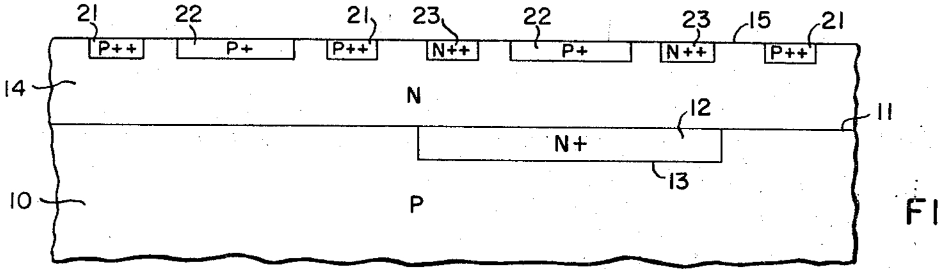

FIG. 2 shows the structure after several distinct quantities of doping material have been deposited on the surface 15 of layer 14. These include a first quantity of acceptor doping impurity 21 deposited in a pattern that outlines the functional areas of the integrated circuit and is for the purpose of forming isolation walls between those functional portions. Its surface concentration may typically be from about $5\times10^{20}$ to $10^{21}$ atoms per cubic centimeter.

A second quantity of doping impurity, also of the same type as the substrate, is deposited within two of the functional areas for forming a transistor base region and the resistance region. This deposition has a surface concentration of about $5\times10^{18}$ atoms per cubic centimeter.

A third quantity of donor doping material 23 is deposited in a pattern that outlines the configuration of switching transistor structures in order to form a low resistance collector wall that extends from the surface 15 to the subdiffused region 12. This deposition may have a surface concentration of about $10^{21}$ atoms per cubic centimeter.

The various impurity deposition operations may be conventionally formed using oxide masking techniques. Here fast diffusing impurities are preferred. Boron and phosphorus are suitable acceptor and donor impurities, respectively. The impurity depositions are performed only for a time sufficient to deposit on the surface 15 a quantity of doping impurity sufficient to perform the desired diffusion profile upon subsequent redistribution of the impurity. Essentially these quantities of doping impurity form shallow diffused regions within the surface 15 as illustrated.

It is to be noted that the oxide diffusion masks are omitted from the illustrated structure.

Doping impurity depositions 21 and 22 are either deposited separately or a first deposition is made in both areas with an additional subsequent deposition made in the area for pattern 21 so that it is more highly concentrated with doping impurities. Hence, it is designated p++ while that for the area 22 is p+. The reason for this difference in concentration is so that upon subsequent redistribution by a single heating operation the impurities within the pattern 21 will extend all the way through the layer 14 while those in the pattern 22 will not. The necessary concentration of impurities in the depositions may be readily calculated by known techniques in accordance with the thickness and resistivity of the epitaxial layer 14.

The deposition for the collector wall 23 is also highly doped and hence designated n++ because impurities in that deposition must also extend through the epitaxial layer 14 down to the region 12. Because of its higher concentration the deposition 23 is preferably performed first.

Figure 3:
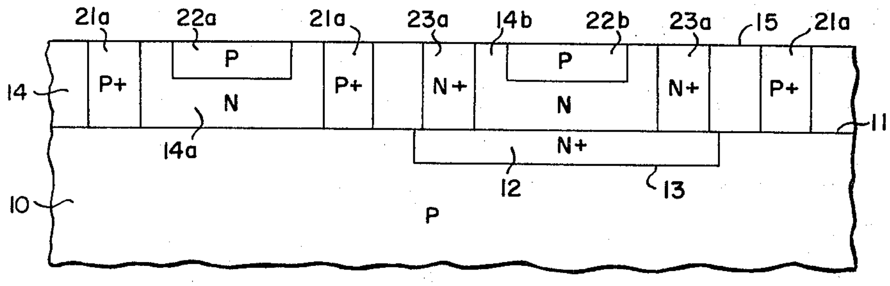

FIG. 3 shows the structure after a single heating operation has been performed for the redistribution of the impurities previously deposited. These form an isolation wall 21*a*, transistor base and resistance regions 22*b* and 22*a*, respectively, and a collector wall 23*a*. The isolation wall 21*a* divides the epitaxial layer into a plurality of isolation portions such as 14*a* and 14*b*. Typically, for an epitaxial layer as above described, the redistribution operation may be performed at a temperature of between about 1100° C. to about 1150° C. for a time of from about 1.0 hour to about 1.75 hours, resulting in a doping impurity concentration for the p type regions 22*a* and 22*b* of, typically, from about $5\times10^{17}$ atoms per cubic centimeter to about $5\times10^{18}$ atoms per cubic centimeter with the impurity concentrations of the isolation wall 21*a* and the collector wall 23*a* being at least about two orders of magnitude higher than the base surface concentration.

By virtue of the single heating operation to form the isolation wall 21*a*, the collector wall 23*a* and the base and resistance regions 22*a* and 22*b* in a time at least five hours less than that required for the individual redistribution operations previously required where thicker epitaxial layers and the other disadvantages described where encountered. Consequently there is much less out-diffusion from the n+ layer 12.

Figure 4:
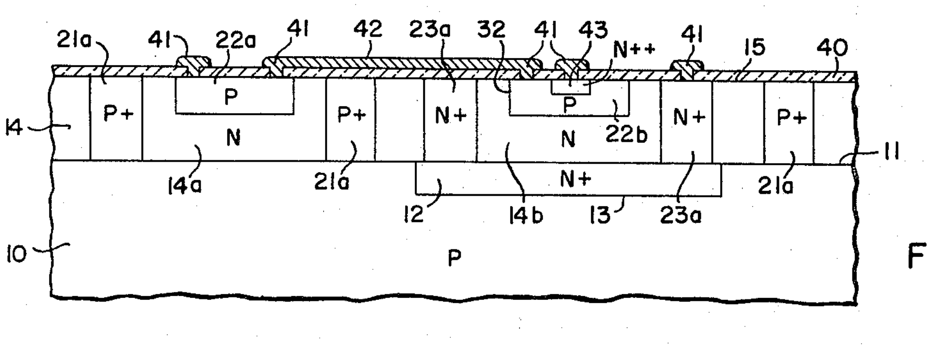

FIG. 4 shows the structure after an additional selective diffusion operation has been performed for a transistor emitter region 43 in the transistor base 22*b*. This region may be conventionally formed to a surface concentration about 5 times $10^{20}$ atoms per cubic centimeter to about 5 times $10^{21}$ atoms per cubic centimeter. The illustrated structure in FIG. 4 also includes the final contact and passivation mask 40, suitably of silicon dioxide, with ohmic contacts 41 at the desired positions on the various functional regions including the extremities of the resistance region 22*a* and each of the emitter, base and collector regions of the transistor. Also illustrated by way of example is an interconnection 42 passing over the oxide layer 40 between one extremity of the resistance region 22*a* and the transistor base region 22*b*. Hence, it is apparent that the practice of the present invention is compatible with existing device technology involving the simultaneous formation of resistors, transistors and other structures in an integrated circuit.

The type of switching transistor employing two epitaxial layers as described in the introduction typically requires a total device diffusion time of about 20 hours. The type of switching transistor structure employing a subdiffused region and a single epitaxial layer performed by conventional high temperature techniques with separate diffusion operations for isolation wall and transistor base regions, without a collector wall, typically requires about 8 hours while in accordance with the present invention a switching transistor structure may be formed requiring a total device diffusion time of less than 3 hours.

Structures made in accordance with this invention may utilize an epitaxial layer as thin as about 4 microns and still maintain high breakdown voltage of the transistor base-collector junction by reason of minimizing the out-diffusion from the subdiffused region. Thus, it is possible to achieve a more idealized transistor structure with additional advantages of shorter processing time, better reproducibility and higher yield.

Improvement in transistor switching type results from the practice of the present invention. Since carrier storage time is proportional to the square of the thickness of the portion of epitaxial layer 14 under base region 22*b*, the ability to use thinner epitaxial layers directly reduces switching time.

With the double epitaxial structure described in the introduction a clearance of about 1.5 mils is required between the base region and the deep diffused region. This is because the double epitaxial thickness of about 15 microns is used and isolation diffusion through this thickness can result in side diffusion of about 1 mil or 25 microns. Reducing the epitaxial layer thickness in the use of simultaneous diffusion as described herein allows one to use a clearance of 15 microns since the side diffusion will only be 5 microns. This allows a reduction in the size of an integrated circuit containing the same number of functional elements by about one half.

To further illustrate the practice of the present invention, and merely by way of further example, the following details useful in forming a switching transistor in accordance with this invention are given:

| | |
|---|---|
| Substrate **10** | Monocrystalline p type silicon, boron doped to a resistivity of about 20 ohm-cm. Thickness of 8 mils. Major surface orientation near (111). |
| Region **12** | Antimony by selective diffusion to a resistivity of .01 ohm-cm. and a junction depth of 5 microns. |
| Epitaxial layer **14** | Thermal decomposition of $SiH_4$ at 1100° C. with $PH_4$ doping source for 7 minutes to form a layer having a thickness of 6 microns and a resistivity of .35 ohm-cm. |
| Isolation wall deposition **21** and region **21***a*. | Boron doping to a surface concentration of $5\times10^{20}$ atoms/cc. |
| Base—resistor decomposition **22** and regions **22***a* and **22***b*. | Boron doping to a surface concentration of $5\times10^{18}$ atoms/cc. |
| Collector wall decomposition **23** and region **23***a*. | Phosphorus doping to a surface concentration of $10^{21}$ atoms/cc. |
| Impurity redistribution to form structure of FIG. 3. | Heat to 1150° C. for 1.5 hrs. |
| Depth of junction formed by base region **22***b*. | 2.5 microns. |
| Surface concentration emitter **43**. | $10^{21}$ atoms/cc. |
| Depth of emitter junction. | 2.0 microns. |

While the invention has been described in only certain forms, it will be apparent that various changes and modifications may be made without departing from the spirit and scope thereof.

What is claimed is:

1. In a method of forming a semiconductor integrated circuit that includes at least one fast switching transistor, the steps comprising: forming in p-n junction relation with a surface of a substrate of a first type of semiconductivity a region of a second type of semiconductivity; forming an epitaxial layer of said second type of semiconductivity on said surface covering said region, said layer having a resistivity substantially greater than that of said region; depositing a first quantity of doping impurity capable of imparting said first type of semiconductivity on a surface of said layer in a pattern for isolating functional elements of the integrated circuit; depositing a second quantity of doping impurity capable of imparting said first type of semiconductivity on said surface in a first isolated portion hereof, said first quantity amounting to a substantially greater concentration of doping impurity per unit area than said second quantity; depositing a third quantity of doping impurity capable of imparting said second type of semiconductivity in a pattern surrounding said second quantity of doping impurity; heating the structure to drive simultaneously said first and third quantities of doping impurity through said layer to form an isolation wall and a collector wall, respectively, and said second quantity of doping impurity to a position within said layer to form a transistor base region, forming an additional region of said second type of semiconductivity in said base region to serve as an emitter region; and forming ohmic contacts at least to said collector wall and said base and emitter regions.

2. In a method of forming a semiconductor integrated circuit, the steps defined in claim 1 wherein simultaneously with said depositing of said second quantity of doping material is deposited a quantity of the same type of doping material in other portions of the structure to be redistributed during said heating step to form resistance regions.

3. In a method of forming a semiconductor integrated circuit, the steps defined in claim 1 wherein said first named region is formed by diffusing antimony into a selected portion of the substrate surface.

4. In a method of forming a semiconductor integrated circuit, the steps defined in claim 1 wherein said layer is formed by an epitaxial growth process at a temperature of less than about 1150° C.

References Cited

UNITED STATES PATENTS

| | | | |
|---|---|---|---|
| 3,183,128 | 5/1965 | Leistiko et al. | 29—571 |
| 3,237,062 | 2/1966 | Murphy. | |
| 3,256,587 | 6/1966 | Hangstefer | 29—577 |
| 3,289,267 | 12/1966 | Ullrich | 29—578 |

WILLIAM I. BROOKS, *Primary Examiner.*